US012267007B1

(12) United States Patent
Tang (10) Patent No.: US 12,267,007 B1
(45) Date of Patent: Apr. 1, 2025

(54) FAULT-TOLERANT CONTROL FOR STATIC TRANSFER SWITCH SYSTEM

(71) Applicant: L3Harris Technologies, Inc., Melbourne, FL (US)

(72) Inventor: Lixin Tang, Irvine, CA (US)

(73) Assignee: L3Harris Technologies, Inc., Melbourne, FL (US)

( * ) Notice: Subject to any disclaimer, the term of this patent is extended or adjusted under 35 U.S.C. 154(b) by 0 days.

(21) Appl. No.: 18/526,276

(22) Filed: Dec. 1, 2023

(51) Int. Cl.
*G01R 35/00* (2006.01)
*H02M 3/04* (2006.01)

(52) U.S. Cl.
CPC .............. *H02M 3/04* (2013.01); *G01R 35/00* (2013.01)

(58) Field of Classification Search
None
See application file for complete search history.

(56) References Cited

U.S. PATENT DOCUMENTS

| 5,138,184 | A | * | 8/1992 | Keefe | H02J 9/06 307/64 |
| 6,542,023 | B1 | * | 4/2003 | Daun-Lindberg | H03K 17/735 307/85 |
| 7,816,815 | B2 | * | 10/2010 | Siciliano | G01R 29/16 307/126 |
| 11,050,250 | B2 | | 6/2021 | Pfitzer et al. | |
| 12,111,359 | B2 | * | 10/2024 | Srivastava | G01R 31/327 |

* cited by examiner

*Primary Examiner* — Jeffrey S Zweizig
(74) *Attorney, Agent, or Firm* — Edell, Shapiro & Finnan, LLC (57) ABSTRACT

An apparatus comprises: a first power source to generate first voltages; a power switch to supply the first voltages to a load as load voltages or not supply the first voltages to the load; first sensors to sense first sensed voltages based on the first voltages, and load sensors to sense the load voltages to produce sensed load voltages; and a controller to: upon detecting a failure of the first sensors, identify a faulty sensed voltage of the first sensed voltages caused by the failure based on at least the first sensed voltages and whether the power switch supplies or does not supply the first voltages to the load; compute a reconstructed sensed voltage to replace the faulty sensed voltage based on healthy sensed voltages of the first sensed voltages that are not faulty; and monitor the healthy sensed voltages and the reconstructed sensed voltage.

20 Claims, 6 Drawing Sheets

FAULT-TOLERANT CONTROL FOR STATIC TRANSFER SWITCH SYSTEM

TECHNICAL FIELD

The present disclosure relates generally to fault tolerance in a static transfer switch system.

BACKGROUND

A static transfer switch system (STS system, also known as static automatic bus transfer (SABT)) includes voltage sensors to measure power voltages generated by multiple power sources, and a fault algorithm that selects one of the multiple power sources to power a load based on the voltage measurements. Eventually, each voltage sensor fails. Such voltage sensor failures that occur while the STS system operates reduce STS system level performance and reliability because the fault algorithm acts on an incomplete set of voltage measurements.

DESCRIPTION

Overview

In an embodiment, an apparatus comprises: a first power source to generate first voltages; a power switch to supply the first voltages to a load as load voltages or not supply the first voltages to the load; first sensors to sense first sensed voltages based on the first voltages, and load sensors to sense the load voltages to produce sensed load voltages; and a controller to monitor the first sensed voltages and the sensed load voltages and to: upon detecting a failure of the first sensors, identify a faulty sensed voltage of the first sensed voltages caused by the failure based on at least the first sensed voltages and whether the power switch supplies or does not supply the first voltages to the load; compute a reconstructed sensed voltage to replace the faulty sensed voltage based on healthy sensed voltages of the first sensed voltages that are not faulty; and monitor the healthy sensed voltages and the reconstructed sensed voltage.

EXAMPLE EMBODIMENTS

Figure 1:
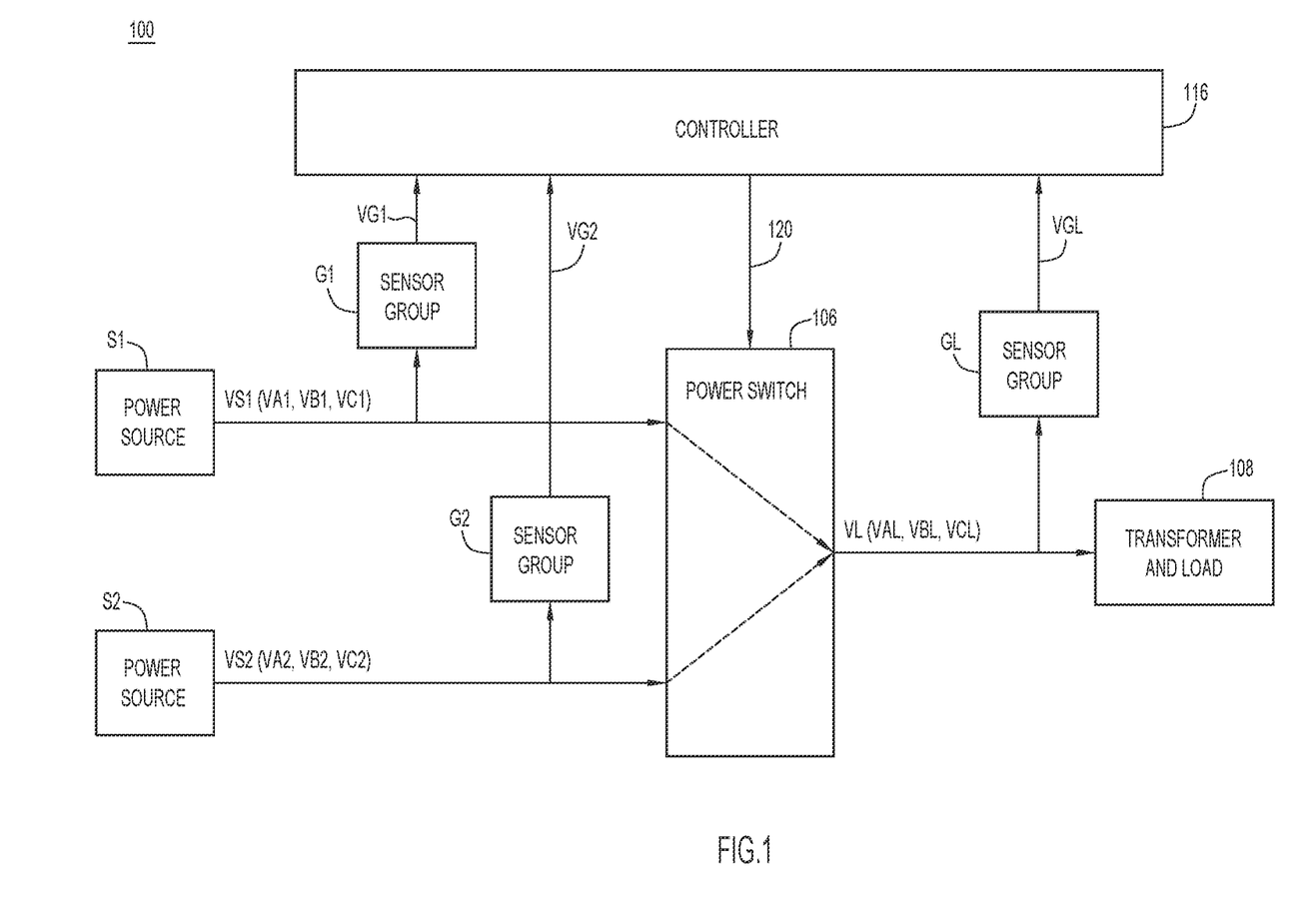
FIG. 1 is a high-level block diagram of an example power system in which fault-tolerant STS operation may be implemented.

FIG. 1 is a high-level block diagram of an example power system 100 (also referred to as an "apparatus"). Power system 100 includes a power source S1 (also referred to as "normal" power source), a power source S2 (also referred to as an "alternate" power source), a power switch 106, a transformer and load 108, sensor groups G1, G2, and GL, and a controller 116 to control the power system. The transformer and load 108 is shown as an example. Embodiments presented herein may be applied to other types of loads.

Power source S1 generates alternating current (AC) three-phase (3φ) voltages VS1 (also referred to as "S1 voltages") including VA1, VB1, and VC1 and provides the same to a first 3Φ input of power switch 106. Power source S2 generates AC 3 φ voltages VS2 (also referred to as "S2 voltages") including VA2, VB2, and VC2 and provides the same to a second 3Φ input of power switch 106 in parallel with the S1 voltages. Power switch 106 selects either the S1 voltages or the S2 voltages as selected voltages for powering transformer and load 108, responsive to a switch control signal 120 generated by controller 116. Power switch 106 passes the selected voltages (from a 3Φ output of the power switch) to transformer and load 108 as 3Ø load voltages VL including VAL, VBL, and VCL, which power the transformer and load. Voltage sensor groups G1, G2, and GL sense/measure the S1 voltages, the S2 voltages, and the load voltages to produce sensed S1 voltages VG1, sensed S2 voltages VG2, and sensed load voltages VGL, respectively, and provide the sensed voltages to controller 116. In the example, the sensed voltages are also 3Φ voltages. Controller 116 generates switch control signal 120 and implements embodiments presented herein based on the sensed voltages.

Power system 100 may operate as an STS system, for example, in which controller 116 commands power switch 106 to connect either power source S1 or power source S2 (i.e., a selected power source) to transformer and load 108, so that either the S1 voltages or the S2 voltages become selected voltages that power the transformer and load. In STS operation, controller 116 monitors the load current and voltage supplied to transformer and load 108 by the (currently) selected power source. Responsive to detecting a selected power source fault based on the monitoring, controller 116 rapidly commands power switch 106 to select the "other" power source (e.g., to switch from power source S1 to power source S2, or vice versa) as an alternate power source to ensure that voltage/power provided to transformer and load 108 is maintained.

Efficient STS operation relies on close monitoring of the S1 voltages, the S2 voltages, and the load voltages using sensor groups G1, G2, and GL. For example, STS operation employs volt*second balancing (VSB) control to reduce transient saturation of transformer windings of transformer and load 108. Efficient VSB control relies on fast and accurate monitoring/comparing of the load voltages, the S1 voltages, S2 Voltages, and the load voltages to achieve a balanced/optimal transfer sequence between power sources, in which case voltage sensor groups G1, G2, and GL play a vital role. Accordingly, embodiments presented herein include a fault-tolerate (FT) algorithm to detect/isolate a faulty voltage sensors among any of voltage sensor groups G1, G2, and GL in real-time, and then re-construct a voltage to replace the faulty sensed voltage from the faulty voltage sensor based on the sensed voltages from other healthy voltages sensors that are not faulty, in order to support normal control during VSB operation, for example. In this way, the embodiments ensue that STS/VSB operation/control operates with a complete set of sensed voltages even when one of the sensed voltages fails. That is, the embodiments detect the voltage sensor failure and compensate for the failure, which allows compensated STS/VSB operation under the fault condition to significantly improve reliability.

Figure 2:
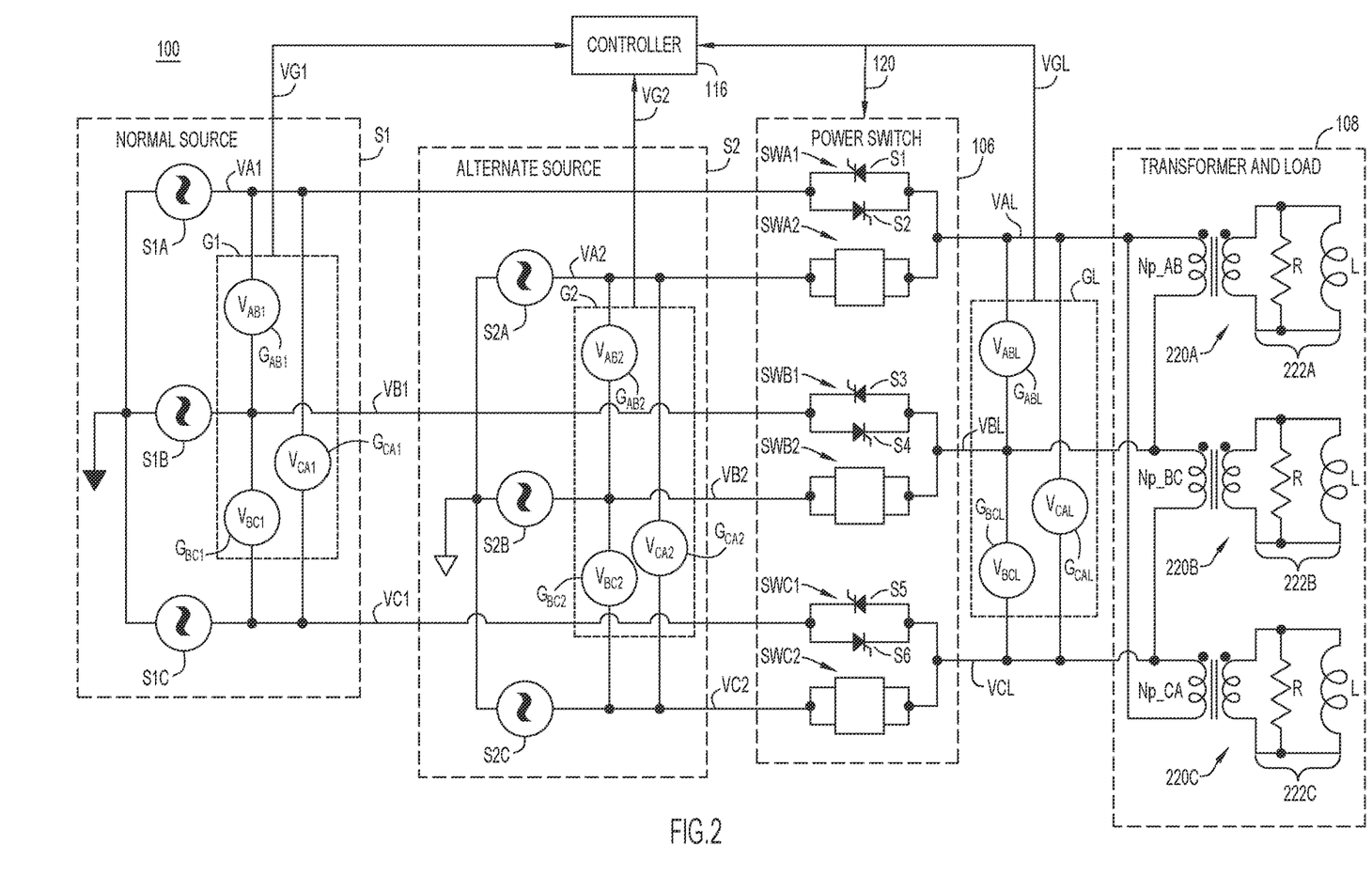
FIG. 2 is a circuit diagram of the power system, according to an embodiment.

FIG. 2 is a circuit diagram of power system 100 expanding on the circuit blocks depicted in FIG. 1, according to an embodiment. Power source S1 includes power sources S1A, S1B, and SIC to generate voltages VA1, VB1, and VC1 (e.g., voltages VS1 from FIG. 1), respectively, and provide the same to power switch 106 over respective voltage lines. Power source S2 includes power sources S2A, S2B, and S2C to generate voltages VA2, VB2, and VC2 (e.g., voltages VS2 from FIG. 1), and provide the same to power switch 106 over respective voltage lines. In one arrangement, power sources S1 and S2 are electrically isolated from each other. FIG. 2 depicts such isolation with different shadings of the neutral connections (which FIG. 2 depicts as inverted triangles) for the two power sources. Specifically, the neutral connection for power source S1 is shaded, while the neutral connection for power source S2 is not shaded. In another arrangement, power sources S1 and S2 are not electrically isolated from each other.

Power switch 106 includes a first set of three parallel switches SWA1 including sub-switch pair (S1, S2), SWB1 including sub-switch pair (S3, S4), and SWC1 including sub-switch pair (S5, S6) having respective inputs to receive voltages VA1, VB1, and VC1 over respective input voltage and respective outputs connected to transformer and load 108 over respective output voltage lines. Each sub-switch pair includes two silicon controlled rectifiers (SCRs) (also referred to as thyristors) connected to each other in oppositely biased directions, between the input and the output of the sub-switch pair, as shown.

Power switch 106 includes a second set of three parallel switches SWA2, SWB2, and SWC2 having respective inputs to receive voltages VA2, VB2, and VC2 and respective outputs connected to transformer and load 108 over respective voltage lines. Switches SWA2, SWB2, and SWC2 respectively include sub-switch pairs (not shown in FIG. 2) configured, and that operate, similarly to the sub-switch pairs of switches SWA1, SWB1, and SWC1, as described above and below.

FIG. 2 shows a particular configuration for power switch 106 by way of example, only. It is understood that any known or hereafter developed AC power switch may be used to selectively connect either power source S1 or power source S2 to transformer and load 108 at any given time under control of controller 116.

As generated by controller 116, switch control signal 120 (also referred to as an "SCR gate control") commands/controls power switch 106 such that either:
  a. Switches SWA1, SWB1, and SWC1 connect/pass/supply voltages VA1, VB1, and VC1 generated by power sources S1A, S1B, and SIC of power source S1 to transformer and load 108 as load voltages VAL, VBL, and VCL (e.g., load voltages VL from FIG. 1); or
  b. Switches SWA2, SWB2, and SWC2 connect/pass/supply voltages VA2, VB2, and VC2 generated by power sources S2A, S2B, and S2C of power source S2 to transformer and load 108 as load voltages VAL, VBL, and VCL.

In this way, power switch 106 is responsible for supplying or not supplying voltages VS1 to transformer and load 108, and for supplying or not supplying voltages VS2 to the transformer and load under control of controller 116.

Sensor group G1 includes three voltages sensors $G_{AB1}$, $G_{BC1}$, and $G_{CA1}$ connected to and between (i.e., across) respective pairs of power sources S1A, S1B, and S2C to sense line-to-line voltages (i.e., relative voltages) $V_{AB1}$ between voltage pair (VA1, VB1), $V_{BC1}$ between voltage pair (VB1, VC1), and $V_{CA1}$ between voltage pair (VA1, VC1). Sensor group G1 provides sensed voltages $V_{AB1}$, $V_{BC1}$, and $V_{CA1}$ to controller 116 as sensed voltages VG1.

Sensor group G2 includes three voltages sensors $G_{AB2}$, $G_{BC2}$, and $G_{CA2}$ connected to and between respective pairs of power sources S2A, S2B, and S2C to sense line-to-line voltages (i.e., relative voltages) $V_{AB2}$ between voltage pair (VA2, VB2), $V_{BC2}$ between voltage pair (VB2, VC2), and $V_{CA2}$ between voltage pair (VA2, VC2). Sensor group G2 provides sensed voltages $V_{AB2}$, $V_{BC2}$, and $V_{CA2}$ to controller 116 as sensed voltages VG2.

Sensor group GL includes three voltages sensors $G_{ABL}$, $G_{BCL}$, and $G_{CAL}$ connected to and between (i.e., across) respective pairs of voltage lines that carry load voltages VAL, VBL, and VCL to sense line-to-line voltages (i.e., relative voltages) $V_{ABL}$ between voltage pair (VAL, VBL), $V_{BCL}$ between voltage pair (VBL, VCL), and $V_{CAL}$ between voltage pair (VAL, VCL). Sensor Group GL provides relative sensed voltages $V_{ABL}$, $V_{BCL}$, and $V_{CAL}$ to controller 116 as sensed voltages VGL.

Controller 116 receives sensed voltages VG1, VG2, and VGL and generates switch control signal 120 based on the sensed voltages and other parameters/conditions described below. Switch control signals 120 may include multiple signals, including one signal for each pair of sub-switches of power switch 106, for example.

Transformer and load 108 includes transformer-load sections 220A, 220B, and 220C associated with respective limbs of a three-limb transformer arranged in a delta configuration, for example. Transformer-load section 220A includes primary-side winding Np_AB to receive load voltage VAL, an opposing secondary-side winding, and a resistive and inductive load (RL) 222A coupled to the secondary-side winding. Transformer-load section 220B includes primary-side winding Np_BC to receive load voltage VBL, an opposing secondary-side winding, and an RL load 222B coupled to the secondary-side winding. Transformer-load section 220C includes primary-side winding Np_CA to receive load voltage VCL, an opposing secondary-side winding, and an RL load 222C coupled to the secondary-side winding. In the above-described arrangement, switches (SWA1 or SWA2), (SWB1 or SWB2), and (SWC1 or SWC2) respectively supply load voltages VAL, VBL, and VCL to transformer-load sections 220A, 220B, and 220C under control of switch control signal 120 generated by controller 116.

In summary, power system 100 includes three sensor groups G1, G2, and GL for power source S1 (e.g., the normal power source), power source S2 (e.g., the alternate power source), and transformer and load 108 voltage sensing. Each sensor group includes three voltage sensors to measure/sense relative voltages between power voltage pairs (ΦA, ΦB), (ΦB, ΦC), and (A, QC).

Embodiments presented herein include a method of voltage sensor fault detection and mitigation (also referred to as "fault-tolerant control") in power system 100 operating as an STS system that implements VSB control, for example. The method includes three main operations 1, 2, and 3 described below. The method assumes that (i) a sensor fault occurs while power system 100 operates in steady-state, and (ii) only one voltage sensor fails at a time. In the example of FIG. 2, the voltage sensor fault detection and mitigation can tolerate 1 faulty voltage sensors per sensor group (where one sensor group has 3 voltage sensors), and normal operation can be maintained in as many as 63 failure patterns Operation 1. Operation 1 includes sensor group fault detection. That is, operation 1 detects that a failure has occurred in a group of sensors, but does not specifically identify a failed voltage sensor in the group that includes the failure. Applying Kirchhoff's Voltage Law (KVL) to the sensed voltages sensed/produced by a group of sensors:

$$V_{ABX}+V_{BCX}+V_{CAX}=0 \quad (1)$$

In equation (1) above, X can be 1, 2 or L, respectively indicating sensor groups for S1, S2, and transformer and load 108. The three voltages listed in equation (1) should be sampled at the same time by respective voltage sensors to avoid/reduce error.

By way of example, setting X=1 examines the voltage sensors of sensor group G1 for power source S1. Applying equation (1) to the sensed voltages from the voltage sensors of sensor group G1 can determine that one voltage sensor in the sensor group (for power source S1) is faulty when the following equation/expression evaluates to true:

$$ABS(V_{AB1}+V_{BC1}+V_{CA1}) \geq V_{MAX} \quad (2)$$

In equation (2) above, $V_{MAX}$ is a predetermined maximum allowed sum (i.e., a maximum allowed (sensed) voltage sum). The maximum allowed voltage sum is a relatively small value (which is related to the voltage sensor's characteristics and the noise/offset of its analog circuit), and is related to non-ideal voltage offsets of the voltage sensors.

Operation 2. Operation 2 follows operation 1 and includes individual voltage sensor detection. That is, once operation 1 has detected a failure in a sensor group, operation 2 determines/identifies specifically which voltage sensor in the sensor group caused the failure. Operation 2 considers two conditions, condition 1 and condition 2.

Condition 1 occurs when the power source related to/monitored by the sensor group with the failure is supplying voltages/power to transformer and load 108 through power switch 106. That is, the sensor group with the failure monitors/senses voltages of the power source that is currently selected to supply voltage to transformer and load 108 by power switch 106. In an example, assume operation 1 detected a failure in sensor group G1 while power source S1 supplies power to transformer and load 108 through power switch 106. In this case:

$$V_{Y1}+VFD=V_{YL} \quad (3)$$

In equation (3) above: Y represents one voltage sensor (labeled based on its sensed voltage) of the sensor group. The voltage sensor may be the voltage sensor that senses voltage $V_{AB1}$, $V_{BC1}$, or $V_{CA1}$; and VFD is a forward voltage drop of two SCRs in power switch 106. VFD is related to a direction and amplitude of a current flowing through the two SCRs, which is normally much smaller than the rated voltage, and its value is related to the forward characteristics of the SCRs and load current. Assuming a predetermined maximum (allowed) forward voltage drop of $VFD_{Max}$ through power switch 106, then operation 2, condition 1 determines that the voltage sensor has failed when:

$$ABS(V_{Y1}-V_{YL}) \geq VFD_{Max} \quad (4)$$

Under condition 1, it is determined that the $V_{Y1}$ voltage sensor is faulty when equation/expression (4) is satisfied/true. This is referred to as a "first method" of identifying the faulty voltage sensor/sensed voltage. Similar logic can be applied to isolate voltage sensor failures in the voltage sensors of sensor group G2 for power source S2 and the voltage sensors of the sensor group GL for the load voltages. As used herein, a voltage sensor that has failed may be referred to as a failed or faulty voltage sensor that produces a failed or faulty sensed voltage. On the other hand, a voltage sensor that has not failed may be referred to as a healthy voltage sensor that produces a healthy sensed voltage.

Condition 2 occurs when the power source related to/monitored by the sensor group is an unloaded power supply that is not supplying power to transformer and load 108. That is, the voltage sensor group with the failure monitors the power source that is not currently selected to supply voltage to transformer and load 108 by power switch 106. Generally, the unloaded power supply generates 3ϕ unloaded voltages that vary in amplitude over a common or matching voltage range across a cycle period of voltages, and the relative voltages between the 3ϕ voltages should also vary over a matching voltage range. Therefore, in this case, a voltage sensor can be determined to be faulty when the voltage sensor produces a sensed voltage (output) that varies over a different voltage range than that of the other two (i.e., remaining) voltage sensors in the group that are not faulty, as measured over a last/previous period of a fundamental frequency cycle of the voltages being monitored. In other words, the faulty sensed voltage varies over a faulty voltage range that differs from that of the other sensed voltages that are not faulty and which operate across voltage ranges that match each other. This is referred to as a "second method" of identifying the faulty voltage sensor/sensed voltage.

Operation 3. Operation 3 follows operation 2. Operation 3 records the identity of the failed voltage sensor, and prevents the voltage sensed by the failed sensor (i.e., the failed sensed voltage) from being used to perform STS/VSB control. In addition, operation 3 (i) reconstructs the failed sensed voltage using the healthy sensed voltages from the other healthy voltage sensors in the same sensor group that did not fail, to produce a reconstructed sensed voltage, and (ii) uses the reconstructed sensed voltage in place (i.e., instead) of the failed sensed voltage (in addition to the remaining healthy sensed voltages) for STS/VSB control. For example, assuming that sensed voltage $V_{AB1}$ is the failed voltage, sensed voltage $V_{AB1}$ can be reconstructed according to KVL as follows:

$$V_{AB1}=-V_{BC1}-V_{CA1} \quad (5)$$

Figure 3A:
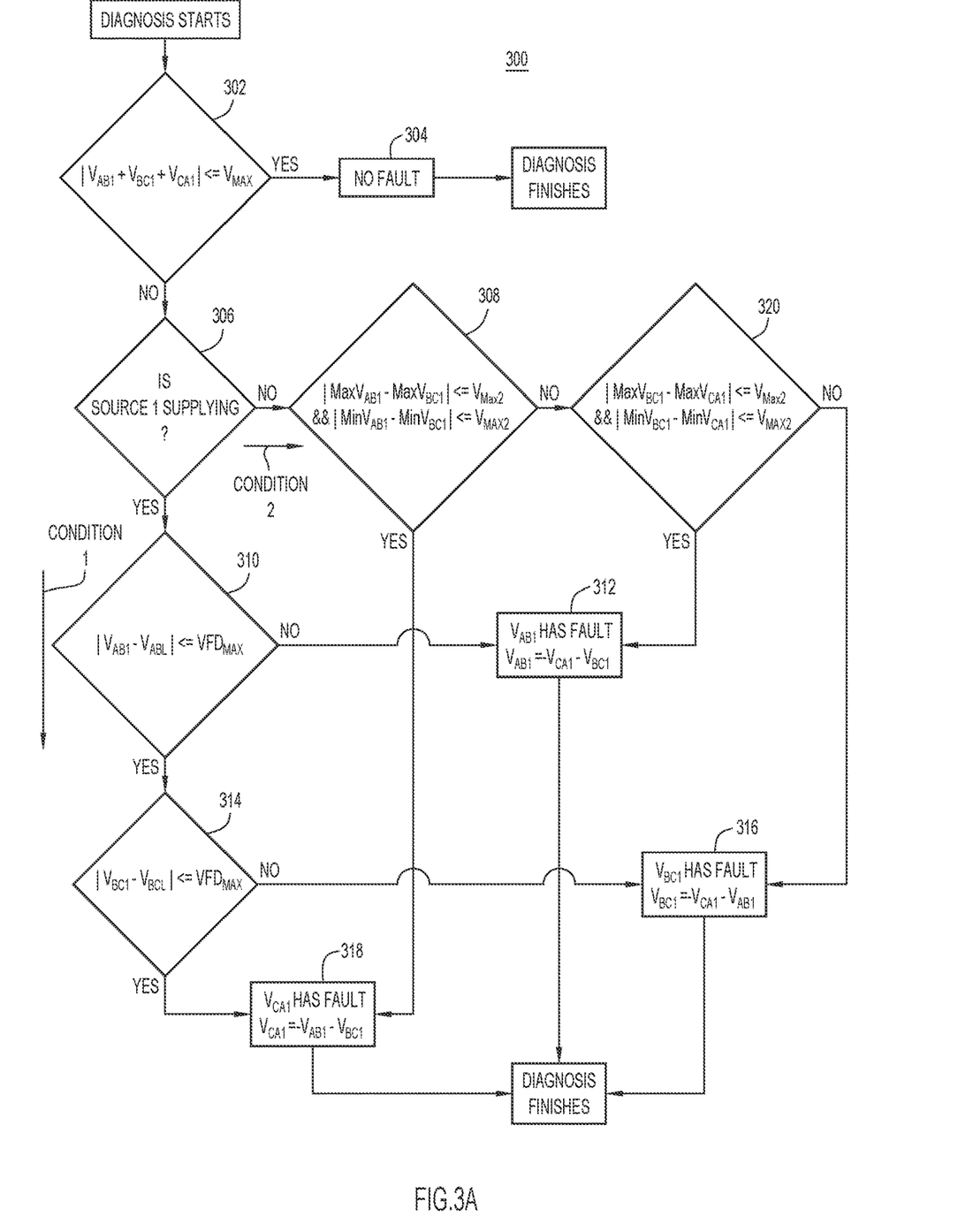
FIG. 3A is a flowchart of an example voltage sensor diagnostic/method applied to a sensor group of the power system.

FIG. 3A is a flowchart of an example voltage sensor diagnostic/method 300 (also referred to simply as a "diagnostic") applied to sensor group G1 of power system 100. The diagnostic may be applied to sensor groups G1, G2, and GL in sequence or in parallel, for example. The diagnostic is described with continued reference to FIGS. 1 and 2.

At 302 (operation 1 above), controller 116 determines/detects whether there is a failure in sensor group G1. To do this, controller 116 evaluates whether ABS ($V_{AB1}+V_{BC1}+V_{CA1}$)<=$V_{Max}$. When the condition is true indicating there is no failure, flow proceeds to 304, where the controller declares there is no failure. The diagnostic ends. On the other hand, when the condition is false indicating there is a failure in sensor group G1, flow proceeds to 306.

Next operations 306-320 implement operations 2 and 3 above.

At 306, controller 116 determines whether condition 1 or condition 2 applies. That is, based on switch control signal 120 generated by controller 116, the controller determines whether power source S1 currently supplies or does not supply power to transformer and load 108 through the power switch. When power source S1 does not supply the power (condition 2), flow proceeds to 308. When power source S1 supplies the power (condition 1), flow proceeds to 310.

Next operations/tests 310 and 314 are performed under condition 1 and next operations/tests 308 and 320 are performed under condition 2.

At 310, controller 116 determines whether voltage sensor $G_{AB1}$ which produces sensed voltage $V_{AB1}$, is faulty. It is understood that a determination as to whether a voltage sensor if faulty and a determination as to whether the sensed voltage produced by the voltage sensor is faulty are based on the same test and may be considered as interchangeable determinations that return interchangeable results. Controller 116 evaluates whether ABS $(V_{AB1}-V_{ABL})<=VFD_{Max}$. That is, controller 116 evaluates whether the voltage drop of sensed voltage $V_{AB1}$ (down to sensed load voltage $V_{ABL}$) across power switch 106 is less than maximum voltage drop $VFD_{Max}$. When the voltage drop is not less than the maximum voltage drop (i.e. the voltage drop exceeds the maximum voltage drop) indicating that voltage sensor $G_{AB1}$ is faulty (and sensed voltage $V_{AB1}$ is faulty), flow proceeds to 312. On the other hand, when the voltage is less than the maximum voltage drop indicating that voltage sensor $G_{AB1}$ is healthy and sensed voltage $V_{AB1}$ is healthy, flow proceeds to 314.

At 312, controller 116 declares that voltage sensor $G_{AB1}$ is faulty and sensed voltage $V_{AB1}$ is faulty. Controller 116 stops using faulty sensed voltage $V_{AB1}$ for the diagnostic and for STS/VSB control. Controller 116 computes a reconstructed sensed voltage to replace faulty sensed voltage $V_{AB1}$ based on remaining healthy sensed voltages $V_{CA1}$ and $V_{BC1}$. For example, controller 116 computes the reconstructed sensed voltage according to the following linear combination of the health voltages:

$$V_{AB1}(\text{reconstructed})=-V_{CA1}-V_{BC1}.$$

Then, controller 116 monitors $V_{AB1}$ (reconstructed) for the diagnostic and SBAT/VSB control. The diagnostic ends.

At 314, controller 116 determines whether voltage sensor $G_{BC1}$ which produces sensed voltage $V_{BC1}$, is faulty. To do this, controller 116 evaluates whether ABS $(V_{BC1}-V_{BCL})<=VFD_{Max}$. When the voltage drop is not less than the maximum voltage drop (i.e., the voltage drop exceeds the maximum voltage drop) indicating that voltage sensor $G_{BC1}$ is faulty and sensed voltage $V_{BC1}$ is faulty, flow proceeds to 316. When the voltage drop is less than the maximum voltage drop indicating that voltage sensor $G_{BC1}$ is healthy and sensed voltage $V_{BC1}$ is healthy, flow proceeds to 318.

At 316, controller 116 declares that voltage sensor $G_{BC1}$ is faulty and sensed voltage $V_{BC1}$ is faulty. Controller 116 stops using faulty sensed voltage $V_{BC1}$ for the diagnostic and for STS/VSB control. Controller 116 computes a reconstructed sensed voltage to replace faulty sensed voltage $V_{BC1}$ based on remaining healthy sensed voltages $V_{CA1}$ and $V_{AB1}$. For example, controller 116 computes the reconstructed sensed voltage according to the following:

$$V_{BC1}(\text{reconstructed})=-V_{CA1}-V_{AB1}.$$

Controller 116 monitors $V_{BC1}$ (reconstructed) for the diagnostic and SBAT/VSB control. The diagnostic ends.

At 318, controller 116 declares that voltage sensor $G_{CA1}$ is faulty and produces faulty sensed voltage $V_{CA1}$ by process of elimination. Accordingly, controller 116 stops using faulty sensed voltage $V_{CA1}$ for the diagnostic and STS operation. Controller 116 computes a reconstructed sensed voltage to replace faulty sensed voltage $V_{CA1}$ based on remaining healthy sensed voltages $V_{AB1}$ and $V_{BC1}$. For example, controller 116 computes the reconstructed sensed voltage according to the following:

$$V_{CA1}(\text{reconstructed})=-V_{AB1}-V_{BC1}.$$

Controller 116 monitors $V_{CA1}$ (reconstructed) for the diagnostic and SBAT/VSB control. The diagnostic ends.

At 308, controller 116 determines whether voltage sensor $G_{CA1}$ which produces sensed voltage $V_{CA1}$, is faulty. To do this, controller 116 determines whether both sensed voltages $V_{AB1}$ and $V_{BC1}$ operate over the same/matching voltage range over a voltage cycle. To do this in the example of FIG. 3A, controller 116 determines whether the following expression is true:

$$|MaxV_{AB1}-MaxV_{BC1}|<=V\text{max2 AND } |MinV_{AB1}-MinV_{BC1}|<=V\text{max2},$$

where MaxV and MinV indicate maximum and minimum values of V over a cycle, and Vmax2 is a comparison matching/equivalency tolerance. An alternative expression to that above may compare voltage ranges $|MaxV_{AB1}-MinV_{AB1}|$ and $|Max V_{BC1}-MinV_{BC1}|$ to each other directly.

When the expression above is true indicating that sensed voltages $V_{AB1}$ and $V_{BC1}$ both operate over the same/matching range, and thus sensed voltage $V_{CA1}$ is faulty by process of elimination, flow proceeds to 318. On the other hand when the expression is false indicating that either $V_{AB1}$ or $V_{BC1}$ is faulty, flow proceeds to 320.

At 320, controller 116 determines whether voltage sensor $G_{AB1}$ which produces sensed voltage $V_{AB1}$, is faulty. To do this, controller 116 determines whether both sensed voltages $V_{BC1}$ and $V_{CA1}$ operate over the same/matching voltage range over a voltage cycle. To do this in the example of FIG. 2, controller 116 determines whether the following expression is true:

$$|MaxV_{BC1}-MaxV_{CA1}|<=V\text{max2 AND } |MinV_{BC1}-MinV_{CA1}|<=V\text{max2}.$$

When the expression is true indicating that sensed voltages $V_{BC1}$ and $V_{CA1}$ both operate over the same/matching range, and thus sensed voltage $V_{AB1}$ is faulty, flow proceeds to 312. On the other hand when the expression is false indicating that $V_{BC1}$ is faulty by process of elimination, flow proceeds to 316.

The diagnostic of FIG. 3A may be applied to sensor group G2 using sensed S2 voltages VG2 and to sensor group GL using sensed load voltages VGL.

Figure 3B:
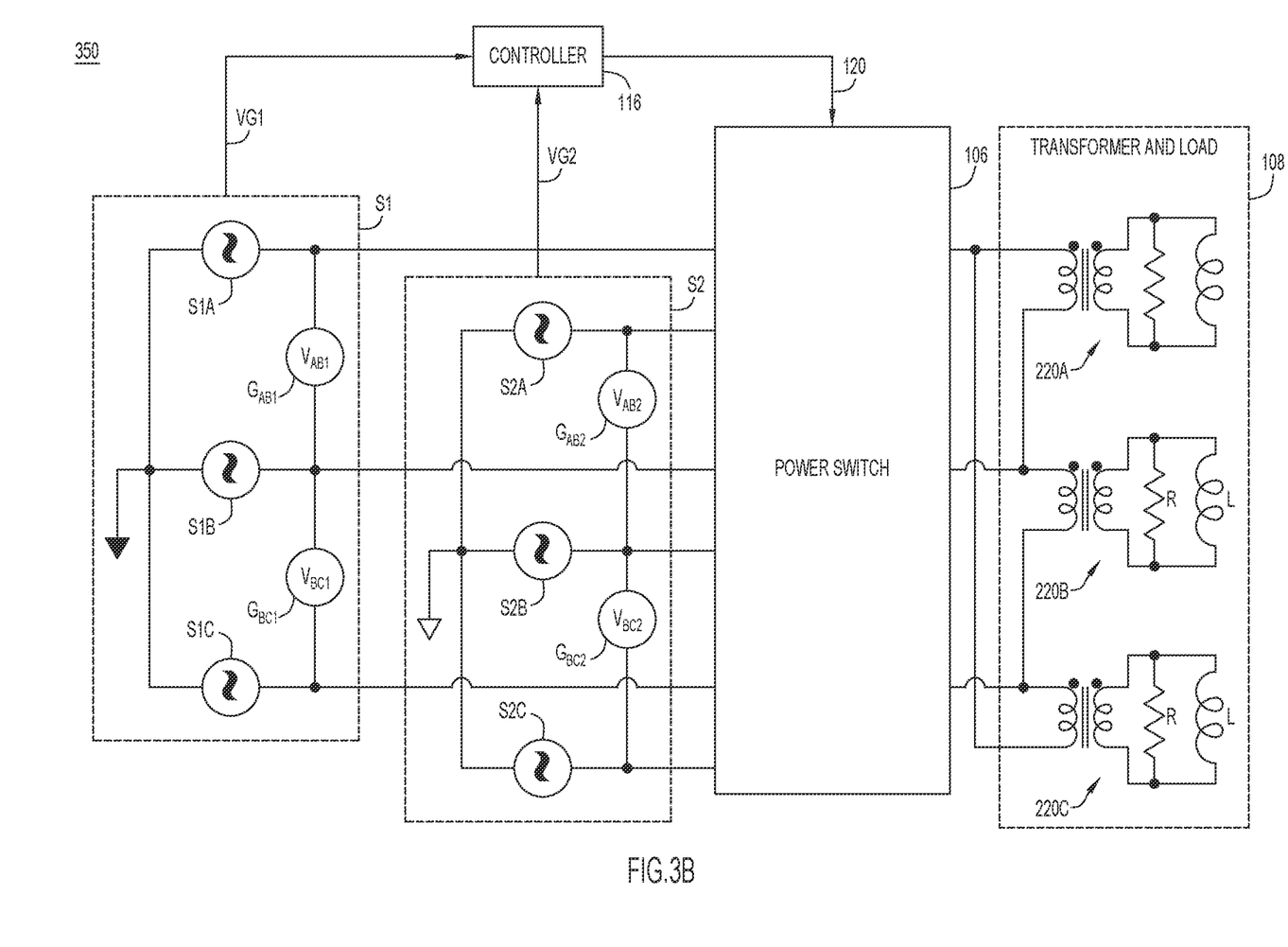
FIG. 3B is a is a high-level block diagram of another example power system in which fault-tolerant STS operation may be implemented and in which failed voltage sensors have been detected and mitigated.

FIG. 3B is a circuit diagram of an example power system 350 similar to power system 100, except that load sensor group GL of the power system 100 is omitted in the power system 350. In power system 350, controller 116 applies the above-described methods based on sensed voltages VG1 and VG2, only. Therefore, controller 116 does not evaluate the above-described voltage drops to diagnose voltage sensor/sensed voltage failures, but rather uses the above-described voltages range comparison test. Also, the example of FIG. 3A assumes that voltage sensors $G_{AC1}$ and $G_{AC2}$ and their sensed voltages $V_{AC1}$ and $V_{AC2}$ have been diagnosed as failed. Thus, controller 116 ignores the failed sensors/sensed voltages, which are omitted in FIG. 3B. Controller 116 reconstructs the failed sensed voltages as described above. FIG. 3B may be used as a low-cost STS system with only two voltage sensors in each voltage sensor group, which measure any two voltages from voltage sensors $G_{ABX}$, $G_{BCx}$, and $G_{CAx}$ (where X can be 1, 2, or L), the third voltages are calculated from KVL. However, in this case, the fault-tolerant capability may not be available.

Figure 4:
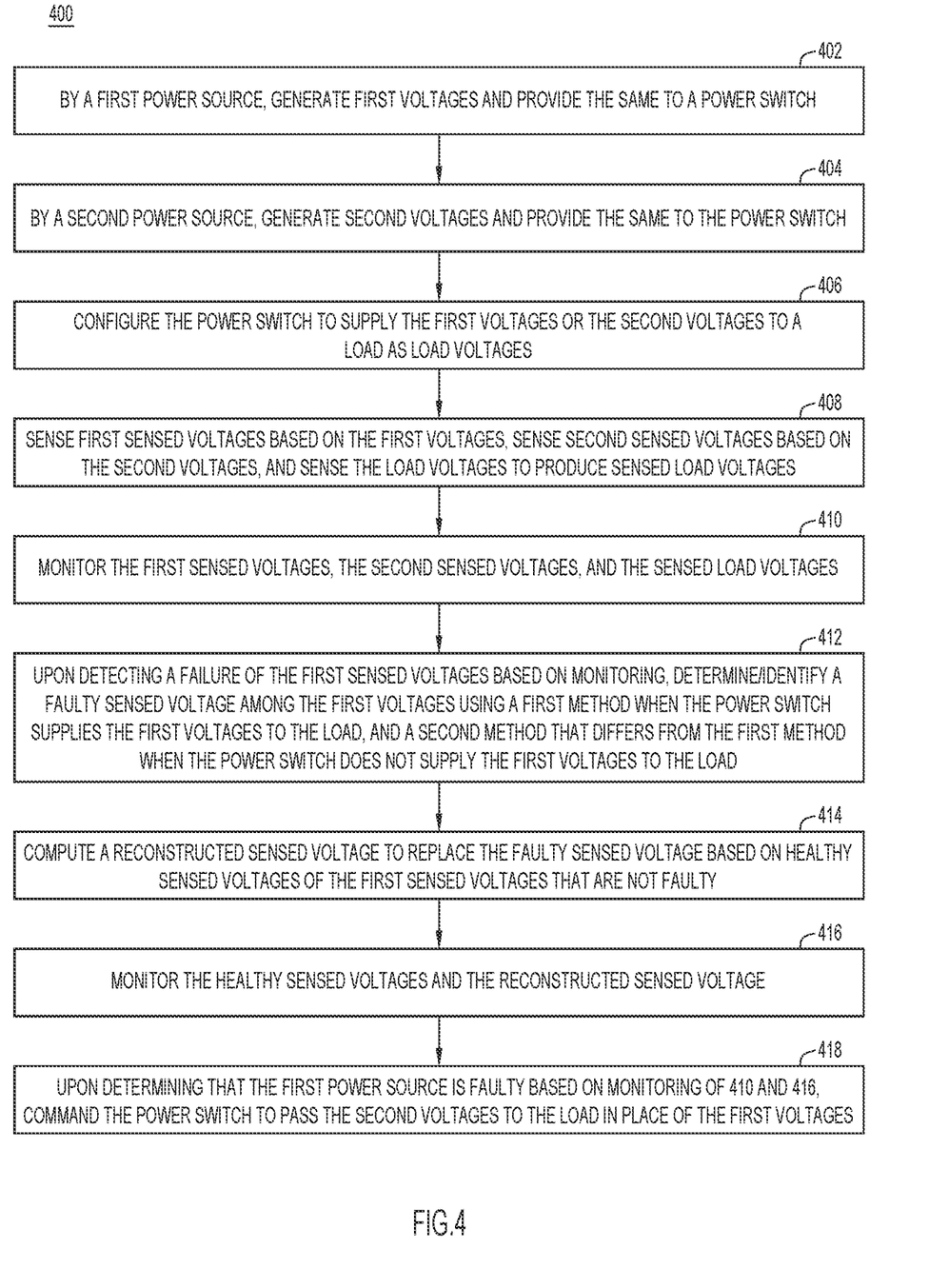
FIG. 4 is a flowchart of an example method of fault-tolerant STS operation.

FIG. 4 is a flowchart of an example method 400 of fault-tolerant STS operation performed in a power system, such as power system 100.

At 402, a first power source generates first voltages and provides the same to a power switch.

At 404, a second power source generates second voltages and provides the same to the power switch.

At 406, a controller configures the power switch to supply (e.g., pass) or not supply (e.g., not pass) the first voltages (through the power switch) to a load as load voltages.

At 408, first sensors sense first sensed voltages based on the first voltages (e.g., the first sensed voltages may be relative voltages between respective pairs of the first voltages), second sensors sense second sensed voltages based on the second voltages (e.g., the second sensed voltages may be relative voltages may be between respective pairs of the second voltages), and load sensors to sense the load voltages to produce sensed load voltages (which may be relative voltages between the load voltages).

At 410, the controller monitors the first sensed voltages, the second sensed voltages, and the sensed load voltages.

At 412, the controller detects a failure of the first sensors based on the monitoring. For example, the controller computes a sum of the first sensed voltages, and detects the failure when the sum exceeds a maximum sum. Upon detecting a failure of the first sensors, the controller determines whether the power switch is configured to supply or not supply the first voltages to the load (i.e., whether the first power source supplies or does not supply the first voltages to the load), and determines an identity of (i.e., identifies) a faulty sensed voltage of the first sensed voltages based on (i) at least the first sensed voltage, and (ii) whether the power switch supplies or does not supply the first voltages to the load, as follows:

a. When the first power source supplies the first voltages to the load (condition 1 above), the controller uses a first method to determine the faulty sensed voltage based on voltage drops of the first voltages across the power switch. According to the first method, the controller computes the voltage drops of the first sensed voltages (down to the sensed load voltages) across the power switch. The controller identifies, as the faulty sensed voltage, whichever of the first sensed voltages has a voltage drop of the voltage drops that exceeds a maximum voltage drop indicative of the failure.

b. When the first power source does not supply the first voltages to the load (condition 2 above), the controller uses a second method to determine the faulty sensed voltage based on voltage ranges over which the first voltages vary over a cycle of the first voltages (and without examining voltage drops). The second method differs from the first method. According to the second method, the controller computes the voltage ranges over which the first voltages operate over the cycle of the first voltages. The controller identifies the faulty sensed voltage as one of the first voltages that operates over a voltage range of the voltage ranges that differs from other first voltages of the first voltages that operate over other voltage ranges of the voltage ranges that match each other.

At 414, the controller computes a reconstructed sensed voltage to replace the faulty sensed voltage based on healthy sensed voltages of the first sensed voltages that are not faulty.

At 416, the controller monitors the healthy sensed voltages and the reconstructed sensed voltage.

At 418, when the first power source powers the load through the power switch, upon determining that the first power source is faulty based on the monitoring of 410 and 416, the controller commands the power switch to pass the second voltages to the load in place of the first voltages to achieve failover redundancy of the first power source and the second power source.

The embodiments implement an algorithm for voltage sensor fault/failure identification/isolation and post-fault operation in delta-connected power systems, for example. The embodiments maintain STS normal operation with multiple failed voltage sensors (e.g., one per sensor group). The algorithm is computationally light, includes addition/subtraction and straightforward logic operations without multiplications and divides and without complex logic, and can operate at very high speeds in FPGA/DSP/microcontrollers, for example. The algorithm can be used as an input voltage validation stage and removes false fault and resulting false triggering generated by voltage sensor failures, improving product reliability. The algorithm improves STS system reliability under voltage sensor fault conditions, and eliminates false faults due to voltage sensor failures and maintains STS normal operation with multiple voltage sensors. The algorithm allows STS system variations with low cost/complexity.

Figure 5:
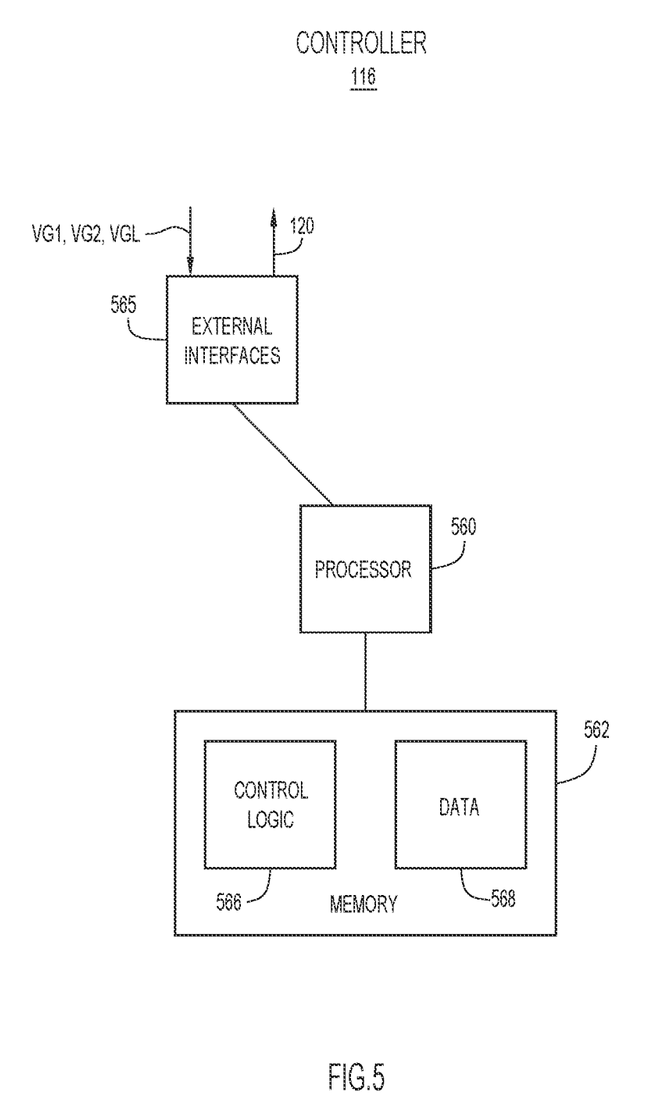
FIG. 5 is a block diagram of a controller of the power system according to an embodiment.

FIG. 5 is a block diagram of controller 116 according to an embodiment. Controller 116 includes processor(s) 560 (which may be a processor), a memory 562, and external interfaces 565 to receive sensed voltages VG1, VG2, and VGL and to provide switch control signal 120 communicatively coupled to one another. The aforementioned components may be implemented in hardware, software, or a combination thereof. Memory 562 stores control software 566 (referred as "control logic"), that when executed by the processor(s) 560, causes the processor(s), and more generally, controller 116, to perform the various operations described herein. The processor(s) 560 may be a microprocessor or microcontroller (or multiple instances of such components). The memory 562 may include read only memory (ROM), random access memory (RAM), magnetic disk storage media devices, optical storage media devices, flash memory devices, electrical, optical, or other physically tangible (i.e., non-transitory) memory storage devices. Controller 116 may also be discrete logic embedded within an integrated circuit (IC) device.

Thus, in general, the memory 562 may comprise one or more tangible (non-transitory) computer readable storage media (which may be a non-transitory computer readable medium) (e.g., memory device(s)) encoded with software or firmware that comprises computer executable instructions. For example, control software 566 includes logic to implement operations performed by the controller 116. Thus, control software 566 implements the various methods/operations described herein.

In addition, memory 562 stores data 568 used and produced by control software 566.

In summary, in some aspects, the techniques described herein relate to an apparatus including: a first power source to generate first voltages; a power switch to supply the first voltages to a load as load voltages or not supply the first voltages to the load; first sensors to sense first sensed voltages based on the first voltages, and load sensors to sense the load voltages to produce sensed load voltages; and a controller to monitor the first sensed voltages and the sensed load voltages and to: upon detecting a failure of the first sensors, identify a faulty sensed voltage of the first sensed voltages caused by the failure based on at least the first sensed voltages and whether the power switch supplies or does not supply the first voltages to the load; compute a reconstructed sensed voltage to replace the faulty sensed voltage based on healthy sensed voltages of the first sensed voltages that are not faulty; and monitor the healthy sensed voltages and the reconstructed sensed voltage.

In some aspects, the techniques described herein relate to an apparatus, wherein: the first sensed voltages include first relative voltages between the first voltages; and the sensed load voltages include load relative voltages between the load voltages.

In some aspects, the techniques described herein relate to an apparatus, wherein the controller is configured to detect the failure by: computing a sum of the first sensed voltages; and detecting the failure when the sum exceeds a maximum sum.

In some aspects, the techniques described herein relate to an apparatus, wherein the controller is further configured to: determine whether the power switch supplies or does not supply the first voltages to the load.

In some aspects, the techniques described herein relate to an apparatus, wherein the controller is configured to, when the power switch supplies the first voltages to the load, identify by: computing voltage drops of the first sensed voltages to the sensed load voltages across the power switch; and identifying, as the faulty sensed voltage, whichever of the first sensed voltages has a voltage drop of the voltage drops that exceeds a maximum voltage drop indicative of the failure.

In some aspects, the techniques described herein relate to an apparatus, wherein the controller is configured to, when the power switch does not supply the first voltages to the load: identify which of the first voltages is the faulty sensed voltage based on the first sensed voltages without the load voltages.

In some aspects, the techniques described herein relate to an apparatus, wherein the controller is configured to, when the power switch does not supply the first voltages to the load, further identify by: computing voltage ranges over which the first voltages operate over a cycle of the first voltages; and identifying the faulty sensed voltage as one of the first voltages that operates over a voltage range of the voltage ranges that differs from other first voltages of the first voltages that operate over other voltage ranges of the voltage ranges that match each other.

In some aspects, the techniques described herein relate to an apparatus, further including: a second power source to generate second voltages; and second voltage sensors to sense second sensed voltages; wherein the power switch is configurable to supply to the load either the first voltages or the second voltages as the load voltages at any given time to achieve failover redundancy of the first power source and the second power source.

In some aspects, the techniques described herein relate to an apparatus, wherein: the first power source is a three-phase (3φ) power source; the first voltages include first three-phase (3φ) voltages (first 3 φ voltages) and the load voltages include 3φ load voltages; the first sensors are configured to sense relative voltages between the first 3 φ voltages; and the load sensors are configured to sense relative voltages between the 3φ load voltages.

In some aspects, the techniques described herein relate to a method including: generating first voltages; configuring a power switch to supply the first voltages to a load as load voltages or not supply the first voltages to the load; sensing the first voltages to produce first sensed voltages, and sensing the load voltages to produce sensed load voltages; upon detecting a failure of the first sensed voltages, identifying a faulty sensed voltage of the first sensed voltages caused by the failure based on at least the first sensed voltages and whether the power switch is configured to supply or not supply the first voltages to the load; computing a reconstructed sensed voltage to replace the faulty sensed voltage based on healthy sensed voltages of the first sensed voltages that are not faulty; and monitoring the healthy sensed voltages and the reconstructed sensed voltage.

In some aspects, the techniques described herein relate to a method, wherein: the first sensed voltages include first relative voltages between the first voltages; and the sensed load voltages include load relative voltages between the load voltages.

In some aspects, the techniques described herein relate to a method, wherein detecting the failure includes: computing a sum of the first sensed voltages; and detecting the failure when the sum exceeds a maximum sum.

In some aspects, the techniques described herein relate to a method, further including: determining whether the power switch is configured to supply or not supply the first voltages to the load.

In some aspects, the techniques described herein relate to a method, wherein, when the power switch supplies the first voltages to the load, identifying includes: computing voltage drops of the first sensed voltages to the sensed load voltages across the power switch; and identifying, as the faulty sensed voltage, whichever of the first sensed voltages has a voltage drop of the voltage drops that exceeds a maximum voltage drop indicative of the failure.

In some aspects, the techniques described herein relate to a method, wherein, when the power switch does not supply the first voltages to the load, identifying includes: identifying which of the first voltages is the faulty sensed voltage based on the first sensed voltages without the load voltages.

In some aspects, the techniques described herein relate to a method, wherein, when the power switch does not supply the first voltages to the load, identifying further includes: computing voltage ranges over which the first voltages operate over a cycle of the first voltages; and identifying the faulty sensed voltage as one of the first voltages that operates over a voltage range of the voltage ranges that differs from other first voltages of the first voltages that operate over other voltage ranges of the voltage ranges that match each other.

In some aspects, the techniques described herein relate to a method, further including: generating second voltages; sensing the second voltages to produce second sensed voltages; and controlling the power switch to supply to the load either the first voltages or the second voltages as the load voltages at any given time to achieve failover redundancy of the first voltages and the second voltages.

In some aspects, the techniques described herein relate to a method, wherein: the first voltages include first three-phase (3φ) voltages (first 3 φ voltages) and the load voltages include 3φ load voltages; the first sensed voltages are first relative voltages between the first 30 voltages; and the sensed load voltages are relative voltages between the 3φ load voltages.

In some aspects, the techniques described herein relate to a non-transitory computer readable medium encoded with instructions that, when executed by a processor of a power system that includes a first power source to generate first voltages, a power switch to supply the first voltages to a load as load voltages or not supply the first voltages to the load, first sensors to sense first sensed voltages based on the first voltages, and load sensors to sense the load voltages to produce sensed load voltages, cause the processor to perform: upon detecting a failure of the first sensed voltages, identifying a faulty sensed voltage of the first sensed voltages caused by the failure based on at least the first sensed voltages and whether the power switch is configured to supply or not supply the first voltages to the load; computing a reconstructed sensed voltage to replace the faulty sensed voltage based on healthy sensed voltages of the first sensed voltages that are not faulty; and monitoring the healthy sensed voltages and the reconstructed sensed voltage.

In some aspects, the techniques described herein relate to a non-transitory computer readable medium, wherein: the first sensed voltages include first relative voltages between the first voltages; and the sensed load voltages include load relative voltages between the load voltages.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

What is claimed is:

1. An apparatus comprising:
   a first power source to generate first voltages;
   a power switch to supply the first voltages to a load as load voltages or not supply the first voltages to the load;
   first sensors to sense first sensed voltages based on the first voltages, and load sensors to sense the load voltages to produce sensed load voltages; and
   a controller to monitor the first sensed voltages and the sensed load voltages and to:
     upon detecting a failure of the first sensors, identify a faulty sensed voltage of the first sensed voltages caused by the failure based on at least the first sensed voltages and whether the power switch supplies or does not supply the first voltages to the load;
     compute a reconstructed sensed voltage to replace the faulty sensed voltage based on healthy sensed voltages of the first sensed voltages that are not faulty; and
     monitor the healthy sensed voltages and the reconstructed sensed voltage.

2. The apparatus of claim 1, wherein:
   the first sensed voltages include first relative voltages between the first voltages; and
   the sensed load voltages include load relative voltages between the load voltages.

3. The apparatus of claim 1, wherein the controller is configured to detect the failure by:
   computing a sum of the first sensed voltages; and
   detecting the failure when the sum exceeds a maximum sum.

4. The apparatus of claim 1, wherein the controller is further configured to:
   determine whether the power switch supplies or does not supply the first voltages to the load.

5. The apparatus of claim 4, wherein the controller is configured to, when the power switch supplies the first voltages to the load, identify by:
   computing voltage drops of the first sensed voltages to the sensed load voltages across the power switch; and
   identifying, as the faulty sensed voltage, whichever of the first sensed voltages has a voltage drop of the voltage drops that exceeds a maximum voltage drop indicative of the failure.

6. The apparatus of claim 4, wherein the controller is configured to, when the power switch does not supply the first voltages to the load:
   identify which of the first voltages is the faulty sensed voltage based on the first sensed voltages without the load voltages.

7. The apparatus of claim 6, wherein the controller is configured to, when the power switch does not supply the first voltages to the load, further identify by:
   computing voltage ranges over which the first voltages operate over a cycle of the first voltages; and
   identifying the faulty sensed voltage as one of the first voltages that operates over a voltage range of the voltage ranges that differs from other first voltages of the first voltages that operate over other voltage ranges of the voltage ranges that match each other.

8. The apparatus of claim 1, further comprising:
   a second power source to generate second voltages; and
   second voltage sensors to sense second sensed voltages;
   wherein the power switch is configurable to supply to the load either the first voltages or the second voltages as the load voltages at any given time to achieve failover redundancy of the first power source and the second power source.

9. The apparatus of claim 1, wherein:
   the first power source is a three-phase (3φ) power source;
   the first voltages include first three-phase (3φ) voltages (first 3 φ voltages) and the load voltages include 3φ load voltages;
   the first sensors are configured to sense relative voltages between the first 3 φ voltages; and
   the load sensors are configured to sense relative voltages between the 3φ load voltages.

10. A method comprising:
    generating first voltages;
    configuring a power switch to supply the first voltages to a load as load voltages or not supply the first voltages to the load;
    sensing the first voltages to produce first sensed voltages, and sensing the load voltages to produce sensed load voltages;
    upon detecting a failure of the first sensed voltages, identifying a faulty sensed voltage of the first sensed voltages caused by the failure based on at least the first sensed voltages and whether the power switch is configured to supply or not supply the first voltages to the load;
    computing a reconstructed sensed voltage to replace the faulty sensed voltage based on healthy sensed voltages of the first sensed voltages that are not faulty; and
    monitoring the healthy sensed voltages and the reconstructed sensed voltage.

11. The method of claim 10, wherein:
    the first sensed voltages include first relative voltages between the first voltages; and
    the sensed load voltages include load relative voltages between the load voltages.

12. The method of claim 10, wherein detecting the failure includes:
    computing a sum of the first sensed voltages; and
    detecting the failure when the sum exceeds a maximum sum.

13. The method of claim 10, further comprising:
    determining whether the power switch is configured to supply or not supply the first voltages to the load.

14. The method of claim 13, wherein, when the power switch supplies the first voltages to the load, identifying includes:
    computing voltage drops of the first sensed voltages to the sensed load voltages across the power switch; and identifying, as the faulty sensed voltage, whichever of the first sensed voltages has a voltage drop of the voltage drops that exceeds a maximum voltage drop indicative of the failure.

15. The method of claim 13, wherein, when the power switch does not supply the first voltages to the load, identifying includes:
   identifying which of the first voltages is the faulty sensed voltage based on the first sensed voltages without the load voltages.

16. The method of claim 15, wherein, when the power switch does not supply the first voltages to the load, identifying further includes:
   computing voltage ranges over which the first voltages operate over a cycle of the first voltages; and
   identifying the faulty sensed voltage as one of the first voltages that operates over a voltage range of the voltage ranges that differs from other first voltages of the first voltages that operate over other voltage ranges of the voltage ranges that match each other.

17. The method of claim 10, further comprising:
   generating second voltages;
   sensing the second voltages to produce second sensed voltages; and
   controlling the power switch to supply to the load either the first voltages or the second voltages as the load voltages at any given time to achieve failover redundancy of the first voltages and the second voltages.

18. The method of claim 10, wherein:
   the first voltages include first three-phase (3φ) voltages (first 3 φ voltages) and the load voltages include 3φ load voltages;
   the first sensed voltages are first relative voltages between the first 3 φ voltages; and
   the sensed load voltages are relative voltages between the 3φ load voltages.

19. A non-transitory computer readable medium encoded with instructions that, when executed by a processor of a power system that includes a first power source to generate first voltages, a power switch to supply the first voltages to a load as load voltages or not supply the first voltages to the load, first sensors to sense first sensed voltages based on the first voltages, and load sensors to sense the load voltages to produce sensed load voltages, cause the processor to perform:
   upon detecting a failure of the first sensed voltages, identifying a faulty sensed voltage of the first sensed voltages caused by the failure based on at least the first sensed voltages and whether the power switch is configured to supply or not supply the first voltages to the load;
   computing a reconstructed sensed voltage to replace the faulty sensed voltage based on healthy sensed voltages of the first sensed voltages that are not faulty; and
   monitoring the healthy sensed voltages and the reconstructed sensed voltage.

20. The non-transitory computer readable medium of claim 19, wherein:
   the first sensed voltages include first relative voltages between the first voltages; and
   the sensed load voltages include load relative voltages between the load voltages.

* * * * *